US007948421B2

(12) United States Patent
McCoy et al.

(10) Patent No.: US 7,948,421 B2
(45) Date of Patent: May 24, 2011

(54) FREQUENCY COUNTER BASED ANALOG-TO-DIGITAL CONVERTER

(75) Inventors: Michael Calvin McCoy, Louisville, KY (US); Christopher Isert, Louisville, KY (US); Douglas Jackson, New Albany, IN (US); John Naber, Goshen, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 24 days.

(21) Appl. No.: 12/477,033

(22) Filed: Jun. 2, 2009

(65) Prior Publication Data

US 2009/0315749 A1    Dec. 24, 2009

Related U.S. Application Data

(60) Provisional application No. 61/130,868, filed on Jun. 3, 2008.

(51) Int. Cl.
*H03M 1/12* (2006.01)
(52) U.S. Cl. .......................... 341/155; 341/164
(58) Field of Classification Search .................. 341/164, 341/118, 120, 143, 144, 155
See application file for complete search history.

(56) References Cited

U.S. PATENT DOCUMENTS 6,917,303 B2 *  7/2005  Stuart-Bruges et al. ... 340/854.6
7,235,987 B2 *  6/2007  Sugino et al. ............... 324/691

OTHER PUBLICATIONS

McCoy, M. C., et al., "A Frequency Counter Based Analog-to-Digital Converter for a RFID Telemetry System,", 50th Midwest Symposium on Circuits and Systems, Aug. 5-8, 2007, pp. 1384-1387.
Isert, C.A., et al., "Digital and Mixed-Signal Integrated Circuits for an RFID Telemetry System," 50th Midwest Symposium on Circuits and Systems, Aug. 5-8, 2007, pp. 1197-1200.
Ghovanloo, M., et al., "A Wideband Frequency-Shift Keying Wireless Link for Inductively Powered Biomedical Implants," IEE Transactions on Circuits and Systems, Dec. 2004, pp. 2374-2383.
Choi, N. et al., "Design of a 13.56 MHz RFID System," Advanced Communication Technology,. ICACT, The 8th International Conference, Feb. 2006, pp. 840-843.
Koopman, P., et al., "Cyclic Redundancy Code (CRC) Polynomial Selection for Embedded Networks," The International Conference on Dependable Systems and Networks, Jun. 28-Jul. 1, 2004., pp. 1-10.
DeHennis, A.D., et al., "A Wireless Microsystem for the Remote Sensing of Pressure, Temperature and Relative Humidity," Journal of Microelectromechanical Systems, vol. 14, No. 1, Feb. 2005, pp. 12-22.
Opasjumruskit, K., et al., "Self Powered Wireless Temperature Sensors Exploit RFID Technology" Pervasive Computing, Jan.-Mar. 2006, pp. 54-61.

(Continued)

*Primary Examiner* — Brian Young
(74) *Attorney, Agent, or Firm* — Foley & Lardner LLP

(57) ABSTRACT

An analog-to-digital converter (ADC) is provided. The ADC includes a variable oscillator, a frequency divider, a clock circuit, and a counter. The variable oscillator is coupled to a sensor and configured to generate an oscillating signal based on a measurement generated by the sensor. The frequency divider is coupled to the variable oscillator and configured to divide a frequency of the oscillating signal. The clock circuit is configured to generate a clock signal at a defined frequency. The counter is coupled to the frequency divider and to the clock and is configured to generate a bit stream representative of a first number of periods of the clock signal during a second number of periods of the divided oscillating signal.

18 Claims, 10 Drawing Sheets

OTHER PUBLICATIONS

Wise, K.D., et al., "Wireless Implantable Microsystems: High-Density Electronic Interfaces to the Nervous System," Proceedings of the IEEE, vol. 92, No. 1, Jan. 2004, pp. 76-97.

Kester, W., et al., "MT-28: Voltage-to-Frequency Converters," Rev 0, Published Feb. 13, 2006, pp. 1-4.

Wantanabe, JT., et al., "An All-Digital Analog-to-Digital Converter With 12-u-V/LSB Using Moving-Average Filtering," IEEE Journal of Solid-State Circuits, vol. 38, No. 1, Jan. 2003, pp. 120-125.

Sorrells, P., Passive RFID Basics, Microchip Techology, Inc., 1998, Accessed Oct. 28, 2006, pp. 1-7, http://ww1.microchip.com/downloads/en/AppNotes/00680b.pdf.

* cited by examiner

US 7,948,421 B2

FREQUENCY COUNTER BASED ANALOG-TO-DIGITAL CONVERTER

CROSS-REFERENCE TO RELATED APPLICATIONS

The present application claims priority to U.S. Provisional Patent Application Ser. No. 61/130,868, filed on Jun. 3, 2008, and titled "FREQUENCY COUNTER BASED ANALOG-TO-DIGITAL CONVERTER FOR A RFID TELEMETRY SYSTEM," the disclosure of which is incorporated herein by reference in its entirety.

REFERENCE TO GOVERNMENT RIGHTS

This invention was made with United States government support awarded by the following agencies: National Institute of Health Grant No. R44 EY014728-03. The United States government has certain rights in this invention.

FIELD

The field of the disclosure relates generally to analog-to-digital converters.

BACKGROUND

In general, signals which measure or detect physical phenomena are analog in form. A digital system, however, supports error-detection processing and more precise methods of signal transmission. To process and analyze analog signals, a device for converting the analog signals into digital values for transmission to and analysis by a computing device is generally used. Such a device is an analog-to-digital converter.

SUMMARY

In an example embodiment, an analog-to-digital converter (ADC) is provided. The ADC includes a variable oscillator, a frequency divider, a clock circuit, and a counter. The variable oscillator is coupled to a sensor and configured to generate an oscillating signal based on a measurement generated by the sensor. The frequency divider is coupled to the variable oscillator and configured to divide a frequency of the oscillating signal. The clock circuit is configured to generate a clock signal at a defined frequency. The counter is coupled to the frequency divider and to the clock and is configured to generate a bit stream representative of a first number of periods of the clock signal during a second number of periods of the divided oscillating signal.

In another example embodiment, a device is provided that includes a sensor and the ADC.

In still another example embodiment, a telemetry system is provided. The telemetry system includes a first device and a second device. The first device includes the sensor, the ADC, and a first coil coupled to receive the bit stream and generate a magnetic and/or an electric field based on the received bit stream. The second device includes a second coil configured to receive the generated magnetic and/or electric field and a signal processor configured to determine the measurement generated by the sensor from the received magnetic and/or electric field.

Other features and advantages of the invention will become apparent to those skilled in the art upon review of the following drawings, the detailed description, and the appended claims.

BRIEF DESCRIPTION OF THE DRAWINGS

Example embodiments of the invention will hereafter be described with reference to the accompanying drawings, wherein like numerals denote like elements.

DETAILED DESCRIPTION

Figure 1:
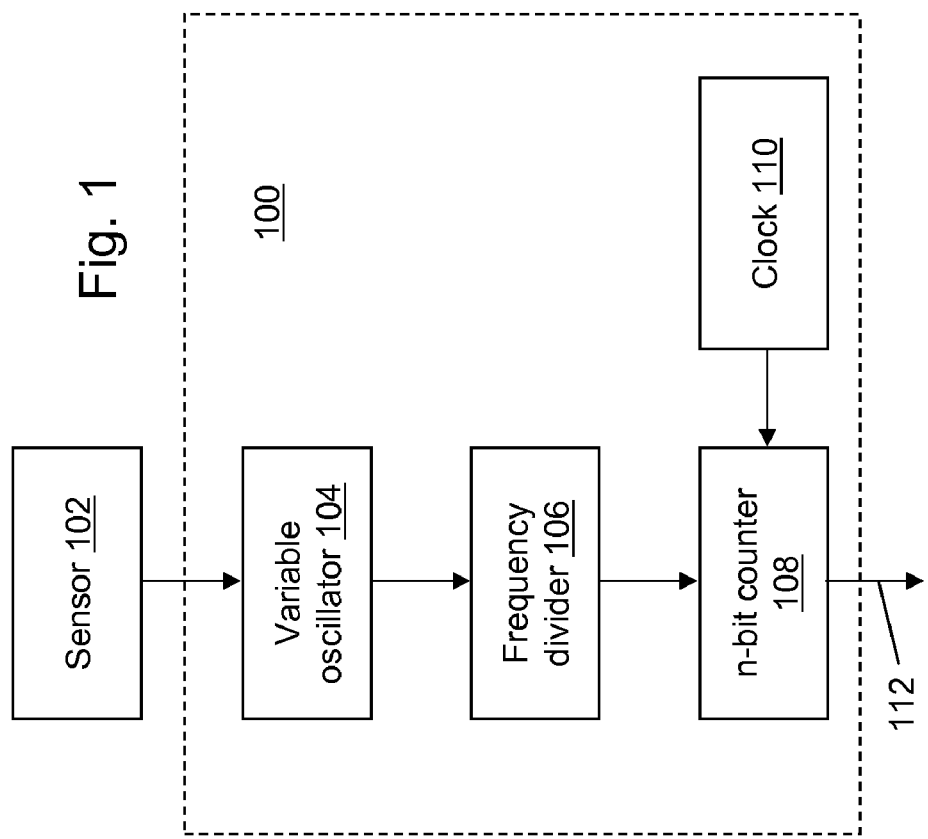
FIG. 1 depicts a block diagram of an analog-to-digital converter (ADC) in accordance with an example embodiment.

With reference to FIG. 1, a block diagram of an analog-to-digital converter (ADC) 100 is shown in accordance with an example embodiment. ADC 100 interfaces and/or integrates with a sensor 102 to receive a measured value in analog form and convert the measured value to a digital value representative of the measured value. ADC 100 may include a variable oscillator 104, a frequency divider 106, an n-bit counter 108, and a clock 110. A counter output value 112 is output from n-bit counter 108. Counter output value 112 is a digital value which includes a number of bits "n" representative of the measured value.

Figure 10:
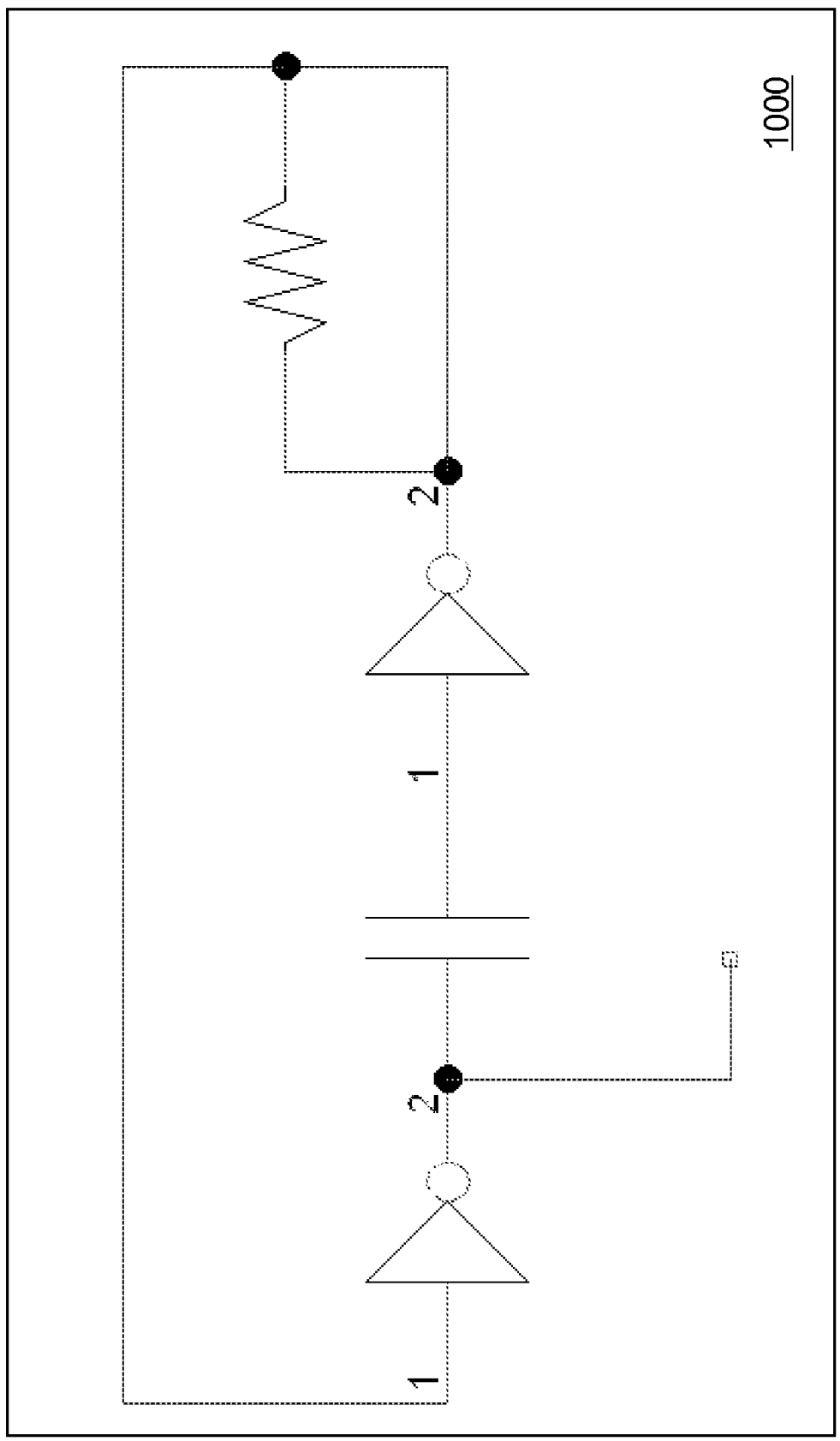
FIG. 10 depicts a circuit diagram of a multivibrator of the RFID tag of FIG. 6 in accordance with an example embodiment.

Sensor 102 may be any type of sensing element that can interface with variable oscillator 104 to cause variable oscillator 104 to vary its frequency responsive to sensor 102. For example, sensor 102 may be a capacitive or a resistive element. In an example embodiment, variable oscillator 104 is a astable multivibrator. A multivibrator is an electronic circuit that can be figured to implement an oscillator. A astable multivibrator includes two unstable states. When initialized, the circuit of the astable multivibrator switches between the two unstable states, remaining in each for a near equal period of time. With reference to FIG. 10, an astable multivibrator circuit 1000 is shown in accordance with an example non-limiting embodiment. With reference to FIG. 10, an astable multivibrator circuit 1000 configured to provide the described functionality of variable oscillator 104 is shown in accordance with an example non-limiting embodiment.

Figure 2:
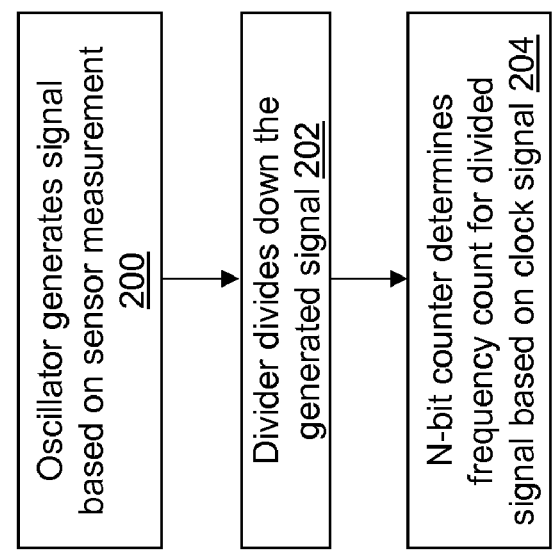
FIG. 2 depicts a flow diagram illustrating example operations performed by the ADC of FIG. 1 in accordance with an example embodiment.
Figure 11:
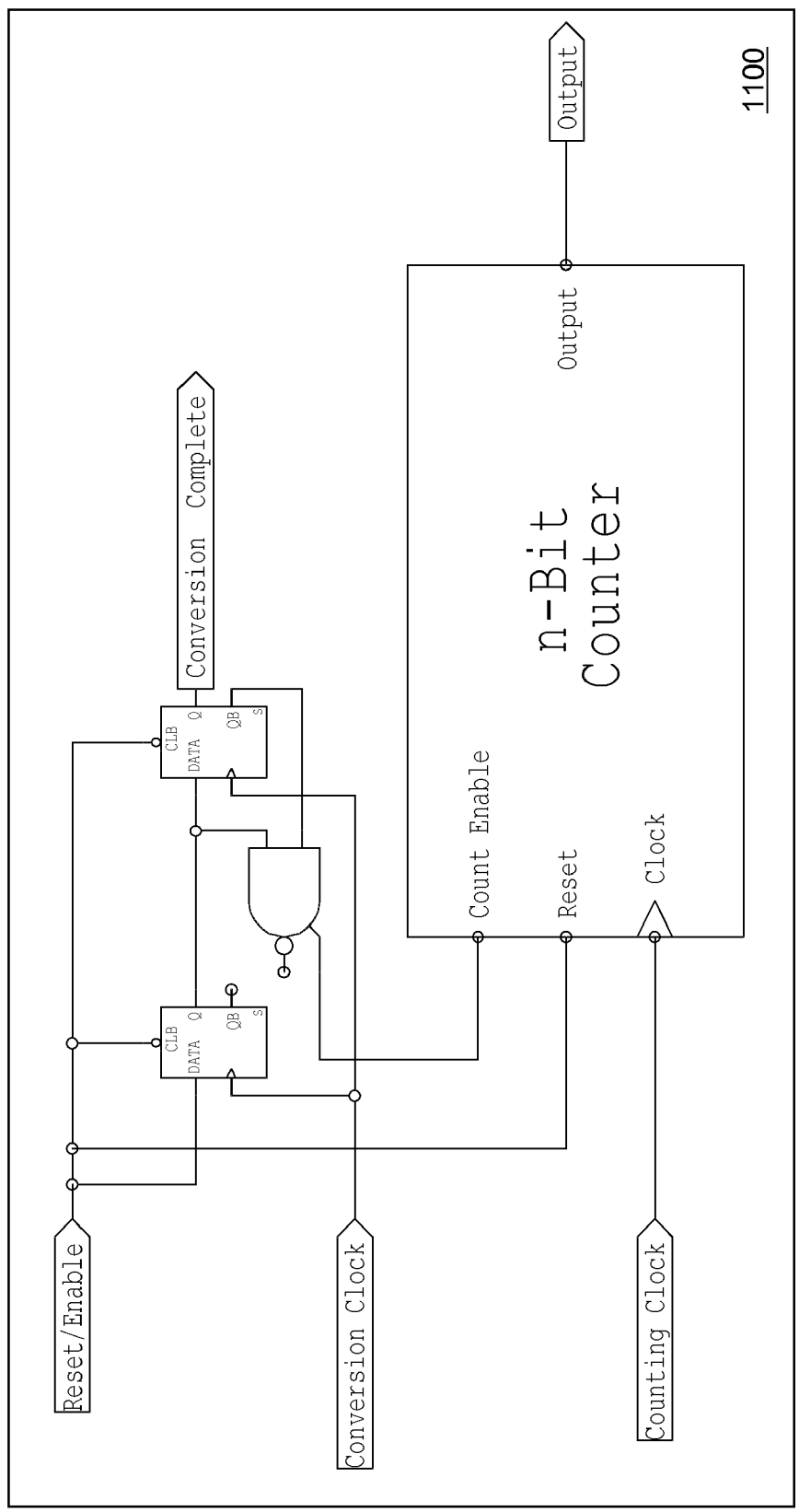
FIG. 11 depicts a circuit diagram of an n-bit counter of the RFID tag of FIG. 6 in accordance with an example embodiment.

With reference to FIG. 2, example operations associated with ADC 100 are described. Additional, fewer, or different operations may be performed, depending on the embodiment. The order of presentation of the operations of FIG. 2 is not intended to be limiting. In an operation 200, variable oscillator 104 generates a signal triggered by a sensor measurement from sensor 102. In an operation 202, frequency divider 106 interfaces with variable oscillator 104 to receive the generated signal and divide the generated signal down. In an example embodiment, frequency divider 106 comprises a flip-flop divider tapped at several points to provide different clock rates. In an operation 204, n-bit counter 108 interfaces with frequency divider 106 to receive the divided signal and to determine counter output value 112. In an example embodiment, n-bit counter 108 is a frequency counter. With reference to FIG. 11, an n-bit counter circuit 1100 configured to provide the described functionality of n-bit counter 108 is shown in accordance with an example non-limiting embodiment. N-bit counter 108 uses the divided signal as a time base and is clocked using a clock signal from clock 110.

Figure 3:
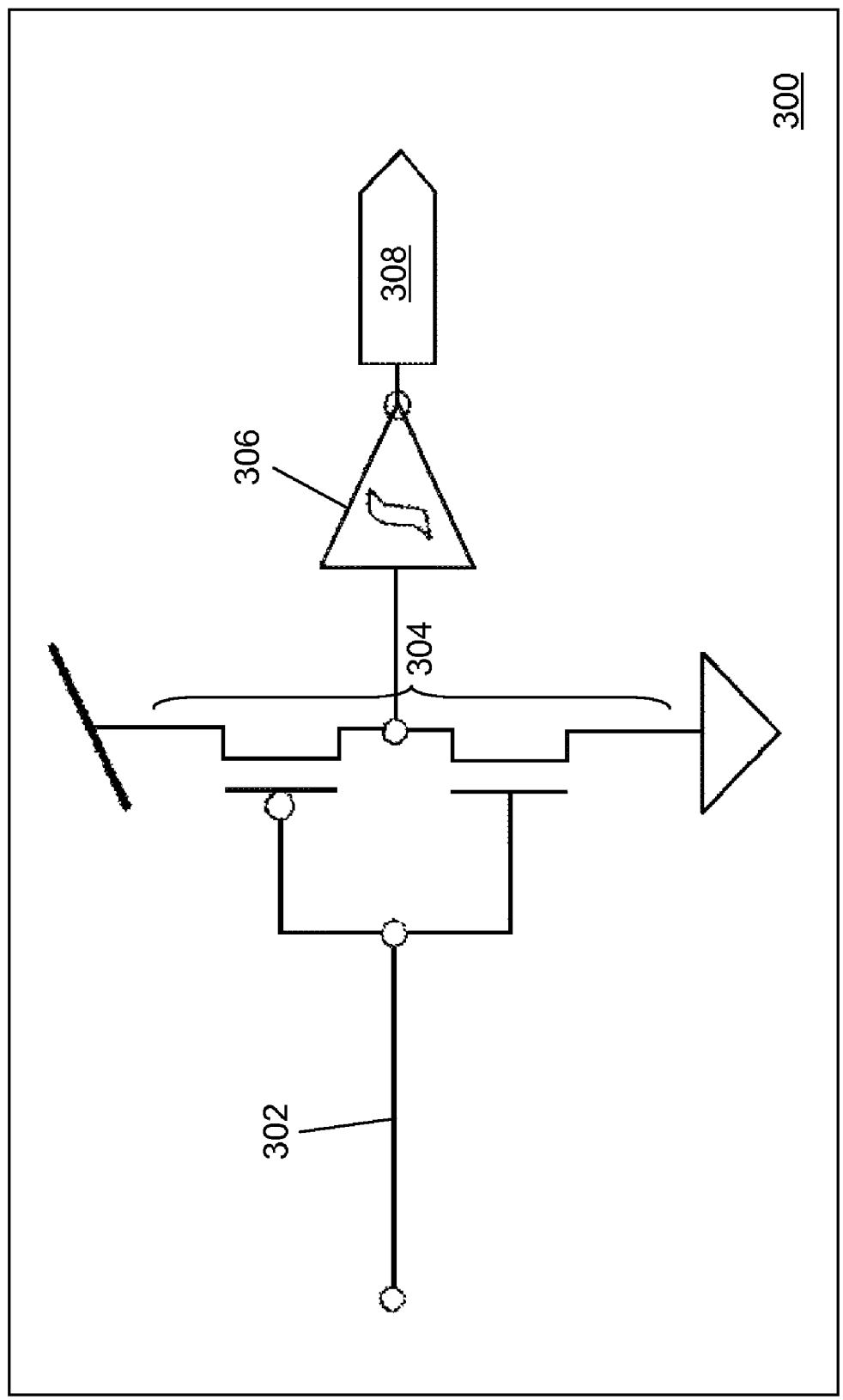
FIG. 3 depicts a circuit diagram of a clock recovery circuit of the ADC of FIG. 1 in accordance with an example embodiment.

In an example embodiment, clock 110 is a clock recovery circuit which recovers a carrier signal received at a device incorporating ADC 100. As an alternative, clock 110 may also be a separate astable multivibrator circuit with fixed discrete components that provides an oscillation signal of known frequency. With reference to FIG. 3, a clock recovery circuit 300 is shown in accordance with an example non-limiting embodiment. Clock recovery circuit 300 converts a sinusoidal carrier signal into a square wave clock signal that can be used to drive n-bit counter 108. The duty cycle of the square wave clock signal is unimportant to the functioning of n-bit counter 108. Additionally, the accuracy of the conversion only relies on the regular period of clock recovery circuit 300. In the example embodiment of FIG. 3, clock recovery circuit 300 is fed by an input signal 302 which is a half-wave rectified version of a received carrier signal. Clock recovery circuit 300 may include a FET push-pull 304 and a Schmitt trigger inverter 306. Schmitt trigger inverter 306 receives input signal 302 from FET push-pull 304 and generates a clock output signal 308 which is a square wave. Schmitt trigger inverter 306 is used to improve the rise and fall times of clock output signal 308. A duty cycle of clock output signal 308 may be less than 50% though the duty cycle of clock output signal 308 is not crucial to the analog-to-digital (A/D) conversion performed by ADC 100. Clock output signal 308 can be connected directly to n-bit counter 108.

N-bit counter 108 may comprise "n" shift registers. N-bit counter 108 is triggered by a first rising edge of the divided variable oscillation signal generated as an output of frequency divider 106 after sensor 102 generates a measurement. Thus, n-bit counter 108 switches from an idle state to a counting mode state. Sensor 102 is integrated/interfaced with variable oscillator 104 to cause variations in the period of variable oscillator 104 based on a measurement by sensor 102. Counting is enabled for one period of the variable oscillation signal. During this period, rising edges of the recovered carrier signal are counted. Counter output value 112 is returned at the end of the counting mode state as an unsigned binary number given as a decimal number by $$Counter_{value} = \frac{D_{max} \cdot f_c}{f_{osc}},$$

where $D_{max}$ is the divider ratio (powers of two) supported by frequency divider 106 and used on the oscillating signal, $f_c$ is the frequency of the carrier signal, and $f_{osc}$ is the frequency of the variably oscillating signal. Thus, the digital value determined during the oscillator period, corresponding to the measurement of sensor 102, is represented as an unsigned binary number with the same number of bits "n" as n-bit counter 108.

The frequency measurement limits of ADC 100 can be defined with the ceiling frequency, $f_{ceiling} = D_{max} \cdot f_c$, being the highest measurable frequency where counter output value 112 of n-bit counter 108 is at least 1, and the floor frequency, $$f_{floor} = \frac{D_{max} \cdot f_c}{Counter_{max}},$$

being the slowest measurable frequency where counter output value 112 of n-bit counter 108 is the largest number possible without n-bit counter 108 rolling over, where $Counter_{max}$ is the largest decimal value n-bit counter 108 can produce.

Figure 4:
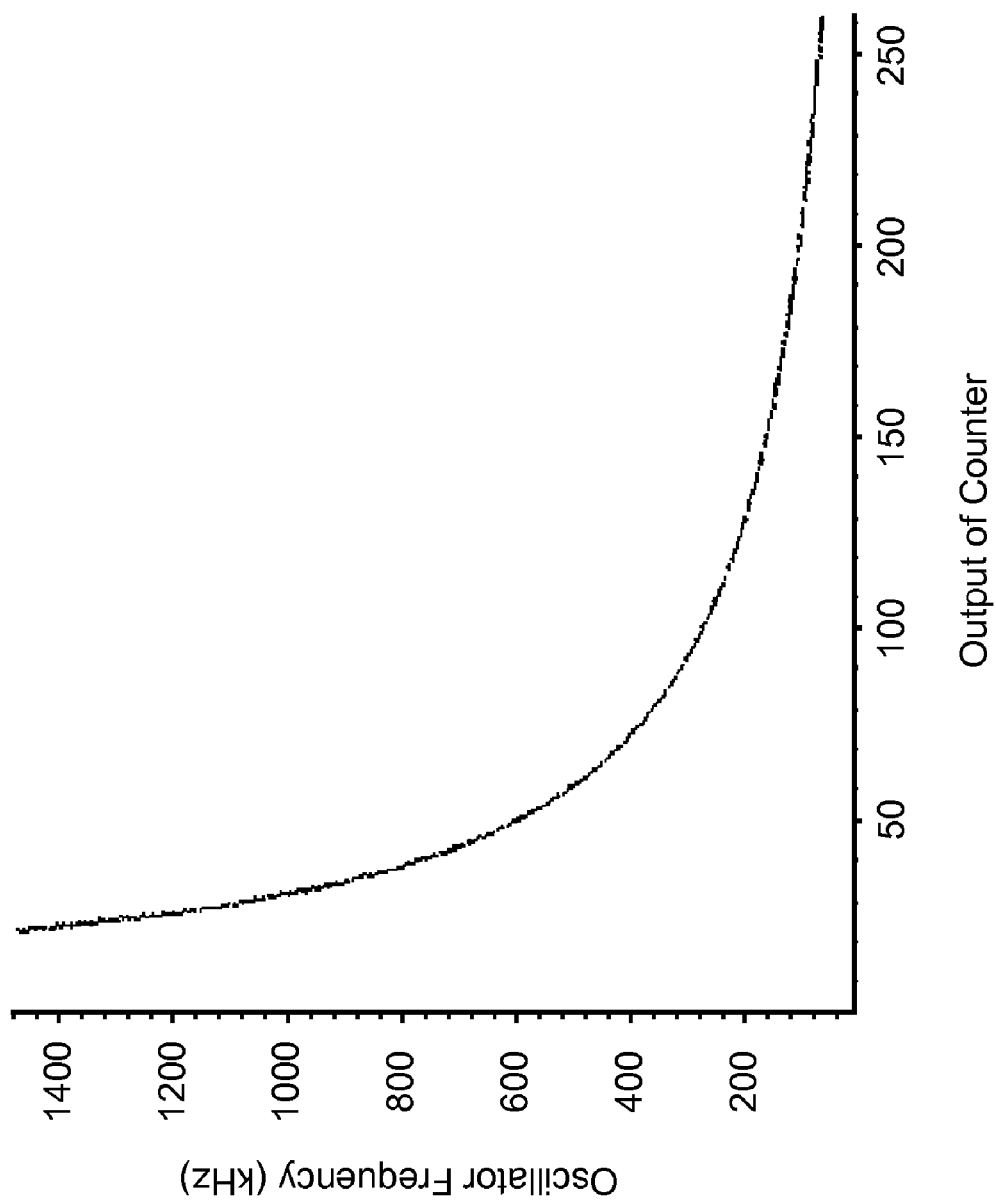
FIG. 4 depicts a relationship between a counter output and an oscillator frequency of the ADC of FIG. 1 in accordance with an example embodiment.

As an example, for a 125 kilohertz (kHz) carrier signal and an 8-bit counter using an eight stage divider (/256) the response over the range of possible frequencies is shown in FIG. 4. The counter response of n-bit counter 108 flattens out significantly as variable oscillator 104 approaches the floor frequency leading to more accurate measurements. Thus, having the frequency range of variable oscillator 104 as close to the floor frequency as possible ensures the most precise A/D conversions. The number of unique values a system can provide over a given range of oscillations is given by $$Values_{unique} = \frac{D_{max} \cdot f_c}{f_{oscmin}} - \frac{D_{max} \cdot f_c}{f_{oscmax}},$$

where $f_{osc\ min}$ is a minimum oscillator frequency of variable oscillator 104 and $f_{osc\ max}$ is a maximum oscillator frequency of variable oscillator 104.

Increasing a size of frequency divider 106 and n-bit counter 108 allows for more unique values for a given range of oscillation, and thus, greater resolution in measurement. Determining the number of counter bits to use and tuning ADC 100 for optimal resolution is dependent on two variables: the divider ratio of frequency divider 106 and the carrier frequency. Assuming a fixed range of oscillation, increasing either of these increases the number of bits of n-bit counter 108 resulting in more accurate readings from n-bit counter 108 and more bits of overall resolution. To demonstrate these two factors, an example variable oscillator 104 having a nominal frequency of 200 kHz and can vary by 5% during sensing (190 kHz to 210 kHz) and an example carrier frequency of 125 kHz is used. The simpler of the two factors to adjust is the divider ratio. By adding stages to the divider, the measurable output of the divider is reduced by a factor of two for each stage which gives the counter a longer time to count, resulting in a more accurate output. Divider stages generally cannot be added indefinitely to improve resolution, however.

As shown above, given a carrier frequency, the combination of the number of bits of n-bit counter 108 and the number of stages of frequency divider 106 determines the floor frequency. For example, a system using the 125 kHz carrier with an 8-bit counter (can count 0-255) using a divide ratio of 256 has a floor frequency of 125.49 kHz. For accurate results, ADC 100 can be tuned such that the oscillator range does not fall on or very near this value, but is still close enough to give the max resolution possible for that particular counter as illustrated in FIG. 4.

Like any ADC, ADC 100 calculates a finite number of binary sequences, and the frequencies measured are prone to a certain amount of error. For example, variable oscillator 104 may be generating an oscillating signal at 246.7 kHz, but the counter calculates 129, which corresponds to 248 kHz resulting in an error of 0.6%. Given the non-linear response, though, the error overall is the smallest at lower frequencies where there are more discrete binary values for a smaller range of frequencies. ADC 100 is thus most accurate for long counts that approach the floor frequency. Above a certain point (in this case, around 400 kHz -500 kHz), the counter may not operate fast enough to produce extremely accurate results.

The actual resolution that a particular combination of n-bit counter 108 and frequency divider 106 are configured to support can be described by the number of unique values Values$_{unique}$. This value can also be described in terms of the number of binary bits used to represent the range of unique values (ex. 4, 8, 16 bits). If the frequency range is held constant while frequency divider 106 and a bit size of n-bit counter 108 are increased, then the theoretical resolution of the system increases accordingly. Thus, a linear increase in the divider ratio (along with the size of the n-bit counter 108) yields a linear increase in the possible resolution for a fixed oscillation range. However, for every 1-bit increase in resolution, a 4-bit overhead penalty between the actual resolution and the number of bits of n-bit counter 108 may result because the full dynamic range of variable oscillator 104 is not used to encompass all possible values of n-bit counter 108. A subset of values above and/or below the counter values of interest may go unused. Because of the unused values, there may be a discrepancy between the size of n-bit counter 108 and its theoretical resolution (i.e. a 12-bit counter that has 8 bits of resolution).

Changing the carrier to a higher frequency allows for more counts in a given oscillator period resulting in a more accurate count without resorting to additional divider stages. Better resolution is achieved over a given oscillation range with less hardware, thus reducing die space and power consumption.

Unlike in most traditional ADCs, where the processing time is limited by the speed of the internal circuitry, a conversion time of ADC 100 is based on the period of the divided oscillation signal. A worst case value for the processing time is $$t_{process} = \frac{D_{max}}{f_{oscmin}}.$$

Figure 5:
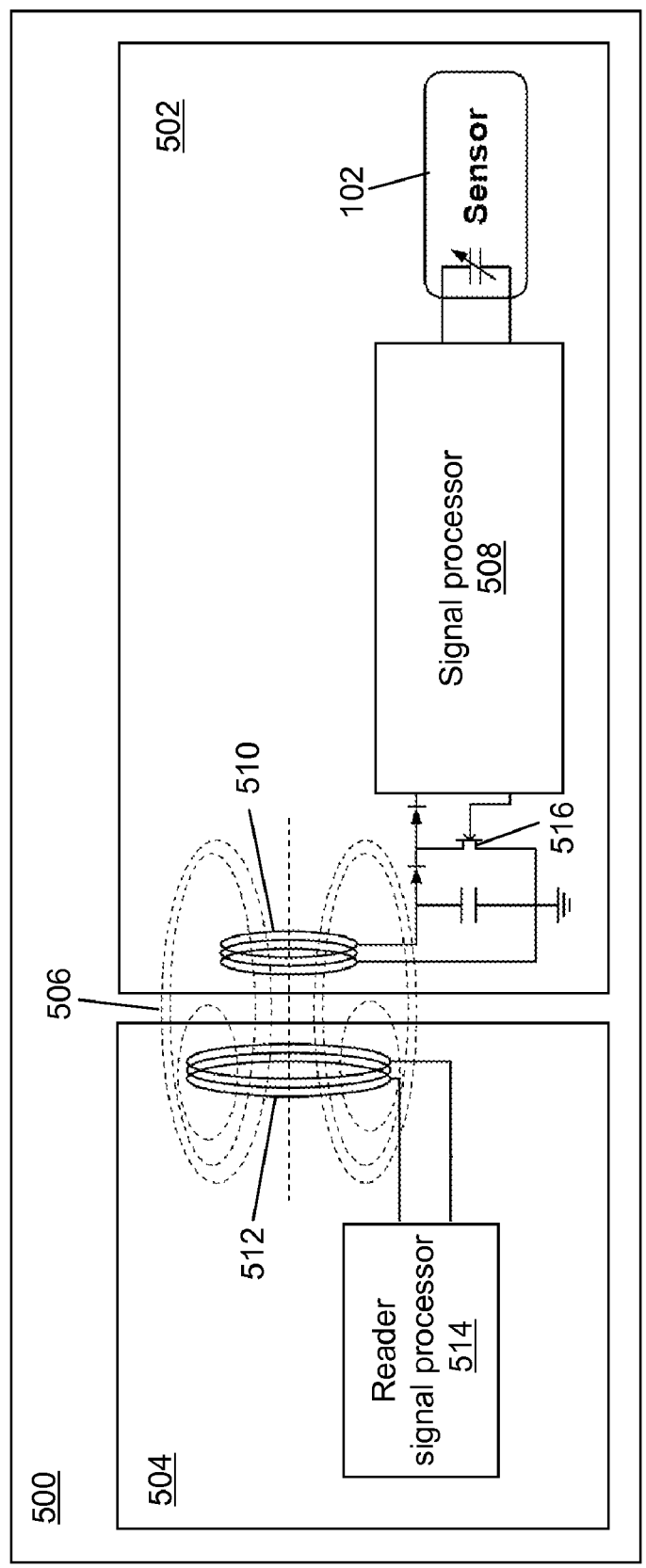
FIG. 5 depicts a partial circuit and a partial block diagram of a radio frequency identifier (RFID) telemetry system in accordance with an example embodiment.

With reference to FIG. 5, a radio frequency identifier (RFID) telemetry system 500 is shown in accordance with an example embodiment. RFID telemetry system 500 may include a tag system 502 and a reader 504. Tag system 502 may include sensor 102, signal processor 508, tag coil 510, and metal-oxide-semiconductor field effect transistor (MOSFET) 516. Reader 504 may include a reader coil 512 and a reader signal processor 514. Energy is communicated between reader 504 and tag system 502 through a magnetic and/or an electric field 506. For example, energy produced in reader coil 512 may be supplied to tag system 502 by magnetic and/or electric field 506 received at tag coil 510. Tag system 502 and a reader 504 may be configured to provide magnetic and/or electric field 506 at a predetermined carrier frequency. For example, RFID designated frequencies include 125 kHz, 13.56 megahertz (MHz), and 900 MHz. Tag coil 510 provides the received energy to signal processor 508 and sensor 102. Signal processor 508 drives MOSFET 516 which forms a signal across tag coil 510 creating a modulated load that is detected in reader coil 512. Thus, information generated by signal processor 508 is supplied to MOSFET 516 and to tag coil 510 and transmitted to reader coil 512 through magnetic and/or electric field 506.

Reader signal processor 514 extracts a data signal from magnetic and/or electric field 506. Magnetic and/or electric field 506 may have been modulated onto the carrier using amplitude-shift keying, phase-shift keying, differential phase-shift keying, frequency-shift keying, amplitude modulation, frequency modulation, pulsewidth modulation, or other modulation techniques. Additionally, magnetic and/or electric field 506 may have been encoded using a variety of encoding methods, and error correction information may be applied to the data signal before transmitting the signal as magnetic and/or electric field 506.

Figure 6:
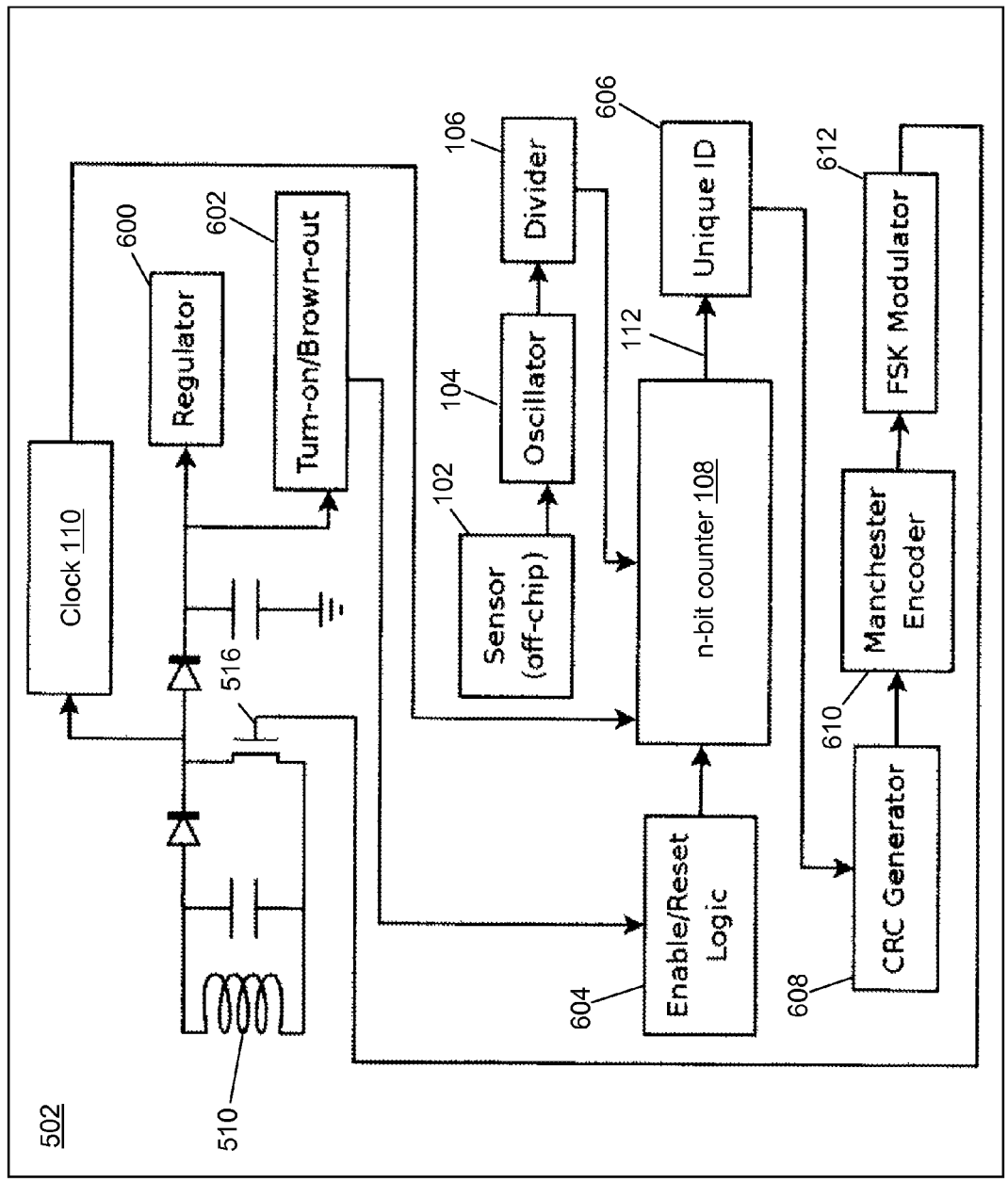
FIG. 6 depicts a partial circuit and a partial block diagram of an RFID tag of the RFID telemetry system utilizing the ADC of FIG. 1 in accordance with an example embodiment.

With reference to FIG. 6, tag system 502 is shown in accordance with an example embodiment. Tag system 502 can be integrated on a single die though sensor 102 may not be formed on the same or a separate die. Tag system 502 includes an integrated circuit and sensor 102 that may be mounted to any type of item to measure a characteristic associated with the item or its environment. Tag system 502 may include tag coil 510, sensor 102, ADC 100 comprised of variable oscillator 104, frequency divider 106, n-bit counter 108, and clock 110, a regulator 600, a turn-on/brown-out circuit 602, an enable/reset logic circuit 604, a unique identifier circuit 606, a cyclic redundancy check (CRC) generator 608, a Manchester encoder 610, a frequency shift key (FSK) modulator 612, and MOSFET 516. Tag coil 510 may provide energy to the remaining components of tag system 502. In an alternative embodiment, tag system 502 may be powered by eye blinking, walking, solar energy, sound, light, vibration, a piezoelectric device, etc.

As known to those skilled in the art, a variety of antennas may be used instead of the coils indicated in the example embodiment of FIGS. 5 and 6. In an example embodiment, tag coil 510 is formed by sputtering layers of titanium and gold onto a cured layer of polyimide. This layer is patterned using photolithography techniques and electroplated to a thickness of 10 microns. The remaining photoresist is removed and the non-electroplated gold seed layer is removed via wet etching methods. The exposed titanium layer is removed using dry plasma etching.

Signal processor 508 generates a data stream transmitted from tag coil 510. Regulator 600 provides rectified and regulated power to the components of tag system 502. Turn-on/brown-out circuit 602 provides a logic signal to enable/reset logic circuit 604 which enables and resets the components of tag system 502 based on the level of the supply voltage. Enable/reset logic circuit 604 monitors the output of turn-on/brown-out circuit 602 and can trigger a complete reset of tag system 502 to prevent transmission of erroneous data that might be generated if tag system 502 is not operating at full power.

As discussed previously with reference to FIG. 1, sensor 102 is integrated/interfaced with variable oscillator 104 to cause variations in the period of variable oscillator 104 based on a measurement by sensor 102. N-bit counter 108 generates a counter output value 112 which is returned at the end of the counting mode state as an unsigned binary number given as a decimal number by $$Counter_{value} = \frac{D_{max} \cdot f_C}{f_{OSC}}$$

and which is representative of the measured sensor value. Unique identifier circuit 606 may be used to add identification bits to the data stream and can be directly set by unique identifier circuit 606. CRC generator 608 may be used to add CRC check bits to the data stream. Manchester encoder 610 may be used to encode the data stream using Manchester encoding logic. FSK modulator 612 may be used to modulate the data stream using FSK modulation. Passing the data stream data bits through both Manchester encoder 610 and FSK modulator 612 results in a unique pattern of long and short clock pulses that are generated for each bit of data. Since only combinations of these unique patterns are present in the final data stream, they can be used to implement a form of simple error correction at reader 504 of RFID telemetry system 500 though the inclusion of CRC check bits in the data stream provides additional error detection.

With reference to the example embodiments of FIGS. 5 and 6, reader system 504 is triggered to provide a signal to reader coil 512. For example, reader system 504 may be triggered automatically or under control of a user of reader system 504. Reader coil 512 couples to tag coil 510 through magnetic and/or electric field 506 by aligning reader coil 512 with tag coil 510 and triggering the signal to reader coil 512. In the example embodiment of FIG. 6, after receipt of the signal from reader coil 512, tag coil 510 enables/resets tag system 502 under control of regulator 600, turn-on/brown-out circuit 602, and enable/reset logic circuit 604. Sensor 102 is triggered to generate a sensor measurement which is converted to a digital value using ADC 100. Following the counting state, tag system 502 enters a transmission state where counter output value 112 is serially shifted through the post-processing system, possibly combined with identification bits and CRC check bits, and encoded for transmission from tag coil 510. Reader system 504 receives the transmitted data stream through reader coil 512 aligned with tag coil 510. Reader signal processor 514 processes the received data stream to determine the value of the generated sensor measurement.

Turn-on/brown-out circuit 602 provides an output logic signal that indicates whether the power supply voltage is high enough to reliably drive the other circuits of tag system 502. Turn-on/brown-out circuit 602 may use a capacitive voltage divider ratio to turn-on a FET push-pull when the unregulated supply voltage reaches a high enough level. Turn-on/brown-out circuit 602 may also provide a reset signal for tag system 502 in the event the supply voltage drops out momentarily.

Figure 7:
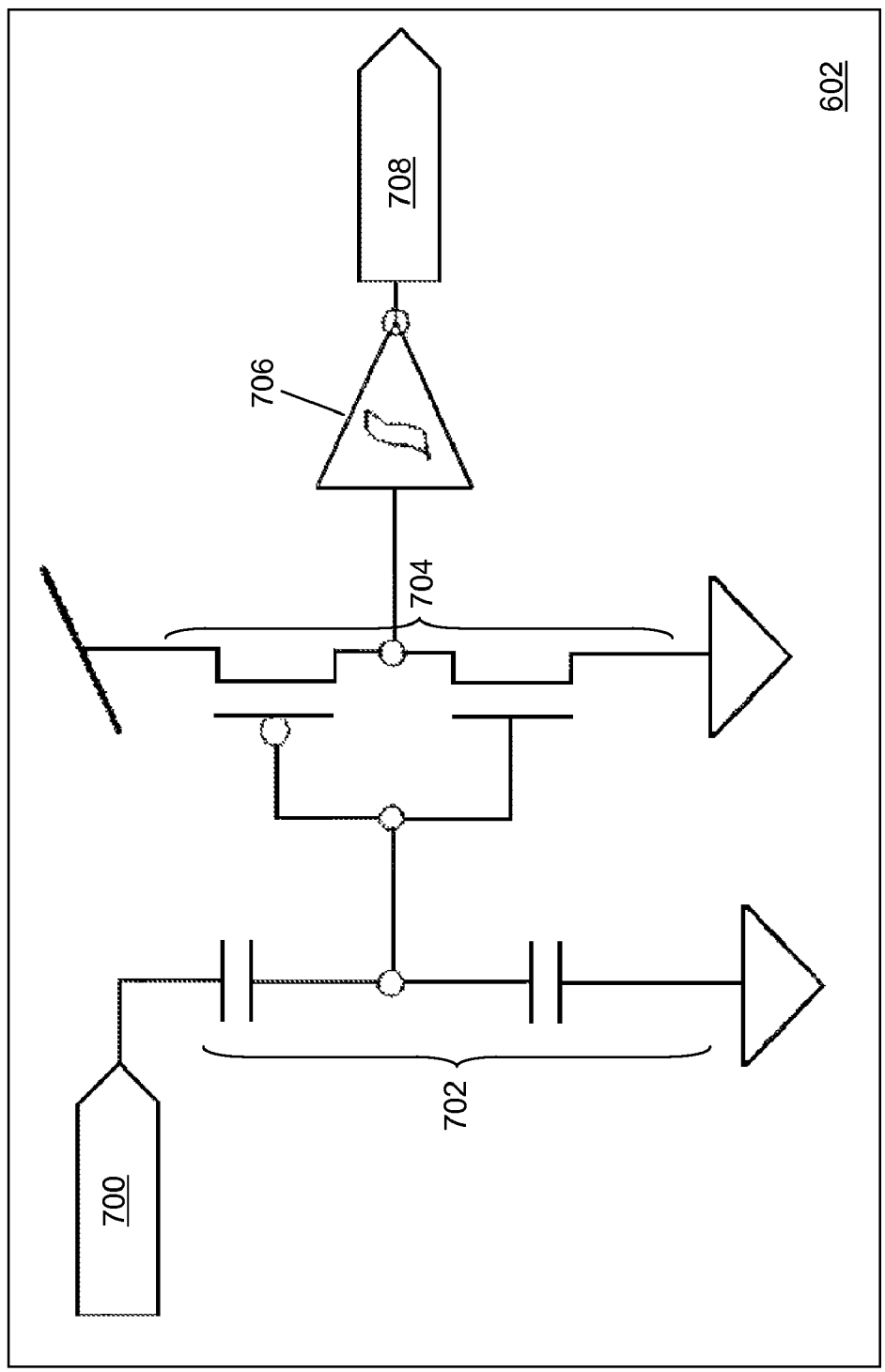
FIG. 7 depicts a circuit diagram of a turn-on/brown-out circuit of the RFID tag of FIG. 6 in accordance with an example embodiment.

With reference to FIG. 7, turn-on/brown-out circuit 602 is shown in accordance with an example non-limiting embodiment. Turn-on/brown-out circuit 602 receives a signal 700 from tag coil 510. Turn-on/brown-out circuit 602 may include a capacitive voltage divider 702, a FET push-pull 704, and a Schmitt trigger inverter 706. Signal 700 provides unregulated DC voltage that is generated by rectifying the voltage received from tag coil 510. By using a capacitive divider instead of a resistive divider, current is not wasted because the capacitors only consume current during their initial charging. Once charged, the capacitors of capacitive voltage divider 702 do not consume any additional current. The capacitor divider ratio of capacitive voltage divider 702 may be set so that the output of turn-on/brown-out circuit 602 is turned on whenever the unregulated DC supply voltage reaches a voltage somewhat above the regulated supply voltage to ensure tag system 502 is not turned on unless the regulated supply voltage has reached its full value. Schmitt trigger inverter 706 speeds up the rise and fall times of output turn-on signal 708.

Figure 8:
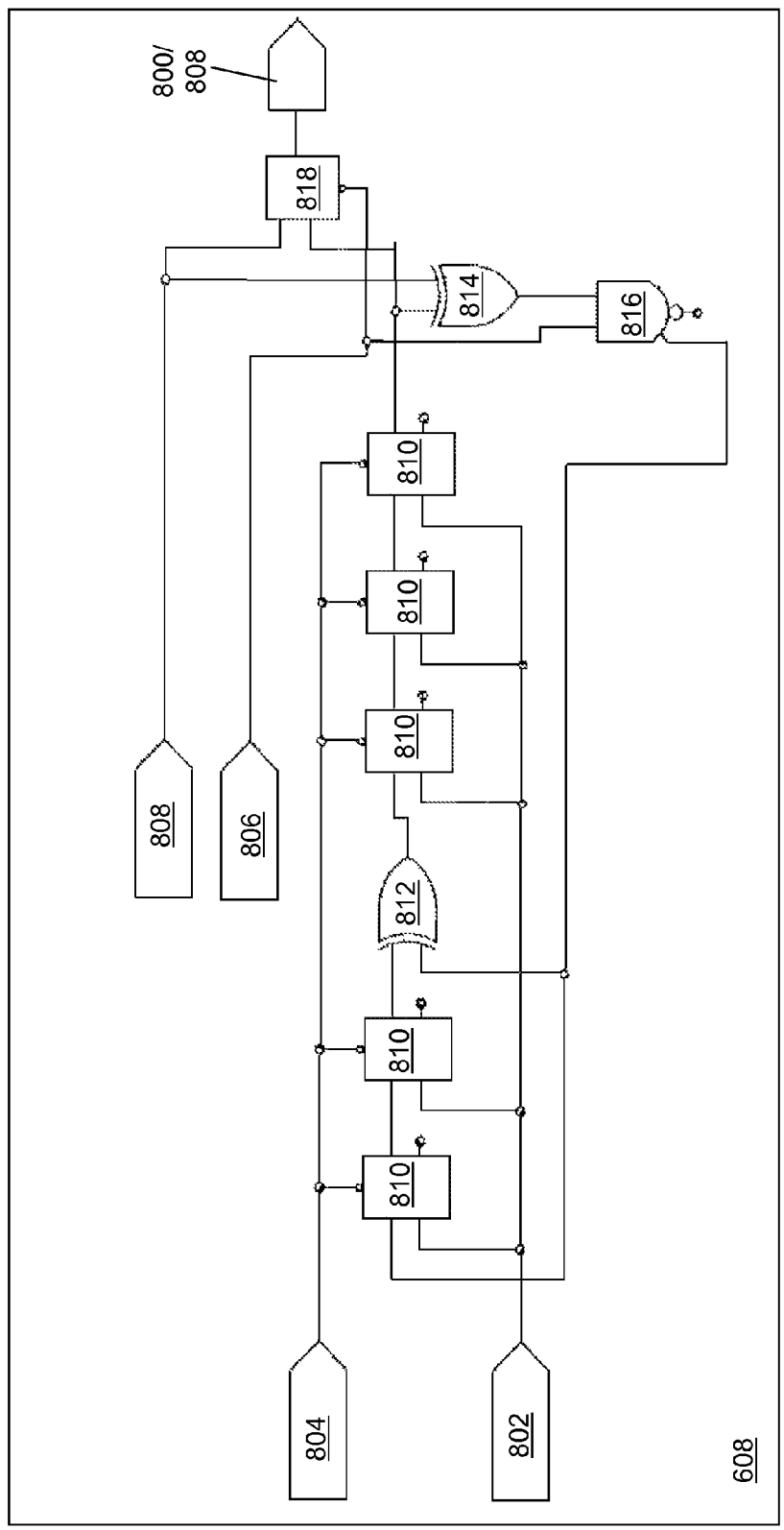
FIG. 8 depicts a circuit diagram of a cyclic redundancy check generator of the RFID tag of FIG. 6 in accordance with an example embodiment.

CRC generator 608 provides check bits for error correction. With reference to FIG. 8, CRC generator 608 is shown in accordance with an example non-limiting embodiment. In the example embodiment of FIG. 8, CRC generator 608 implements a 5-bit CRC and includes a shift register with XOR'ed feedback between bits 2 and 3. The position of the feedback is governed by the chosen CRC polynomial and may vary. The CRC polynomial is a string of bits that is used in a binary division. When a string of bits representing the data stream, which includes counter output value 112 and may include an identification string generated by unique identifier circuit 606, is divided by the CRC polynomial, the remainder of the division is CRC check word 800 output from CRC generator 608. Check word 800 is appended to a data signal 808 also output from CRC generator 608. If the entire string is divided by the CRC polynomial at reader 104, the remainder is zero unless the string and/or check word are corrupted during transmission, in which case, the remainder is non-zero indicating an error.

In the example embodiment of FIG. 8, CRC generator 608 receives a clock signal 802, a reset signal 804, a check word enable signal 806, and data signal 808. For example, data signal 808 comprises counter output value 112 and the identification string generated by unique identifier circuit 606. CRC generator 608 may include a plurality of shift registers 810, a first XOR gate 812, a second XOR gate 814, a NAND gate 816, and a multiplexer 818. Clock signal 802 and reset signal 804 are connected to the plurality of shift registers 810. First XOR gate 812 is positioned between a pair of shift registers of the plurality of shift registers 810 to provide the XOR feedback between bits and defining the polynomial. Second XOR 814 receives data signal 808 and an output of the last shift register of the plurality of shift registers 810. The output of second XOR 814 is input to NAND gate 816 which also receives check word enable signal 806 to provide data signal 808 to the plurality of shift registers 810.

In normal operation, serial data, i.e. data signal 808, passes through CRC generator 608. When a complete data signal 808 has been shifted through, check word enable signal 806 is asserted, and multiplexer 818 switches from data signal 808 to the CRC shift register to output CRC check word 800. A logic zero is placed on data signal 808 and CRC generator 608 is clocked five times (number of bits in check word) using clock signal 802 to push CRC check word 800 out of multiplexer 818. Reset signal 804 resets the plurality of shift registers 810 for the next cycle under control of enable/reset logic circuit 604.

Figure 9:
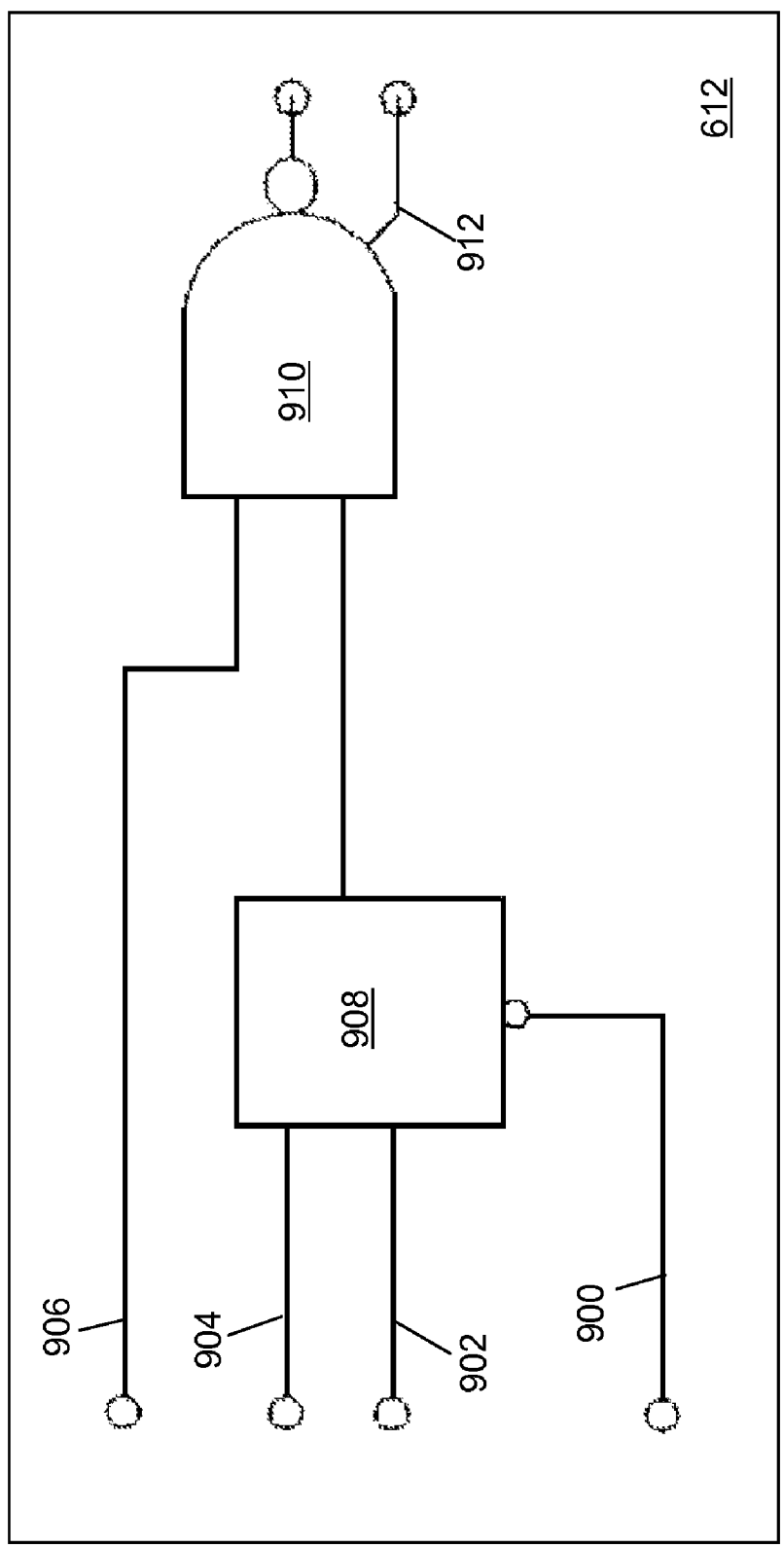
FIG. 9 depicts a circuit diagram of a frequency shift key modulator of the RFID tag of FIG. 6 in accordance with an example embodiment.

FSK modulator 612 modulates the received data stream. With reference to FIG. 9, FSK modulator 612 is shown in accordance with an example non-limiting embodiment. In the example embodiment of FIG. 9, FSK modulator 612 uses a simple multiplexer design. Variable oscillator 104 may be configured to provide a clock signal to frequency divider 106 tapped at several points to provide different clock rates. Serial data may be shifted through tag system 502 using one of the divided down clocks while two of the faster clocks may be input to FSK modulator 612. A logic one in the serial data stream may be represented by a single long clock cycle and a logic zero by two short clock cycles.

With reference to FIG. 9, FSK modulator 612 receives a data stream input signal 900, a first clock signal 902, a second clock signal 904, and a mode signal 906, and outputs modulated signal 912 to drive MOSFET 516. FSK modulator 612 may include a multiplexer 908 and a NAND gate 910. The two clock signals, first clock signal 902 and second clock signal 904, are obtained from taps of frequency divider 106. For example, first clock signal 902 may be a divide-by-16 output of frequency divider 106 and second clock signal 904 may be a divide-by-32 output of frequency divider 106. Data stream input signal 900 is fed to the select input of multiplexer 908. With the clock signals connected as shown in FIG. 9, a logic zero in data stream input signal 900 selects the divide-by-16 clock while a logic one selects the divide-by-32 clock. If data stream input signal 900 is clocked at a rate of divide-by-64, a logic zero is translated into two short clock cycles at the output of multiplexer 908 and a logic one into one long clock cycle to provide Manchester encoding of data stream input signal 900.

Mode signal 906 is supplied by control logic, such as a simple state machine, and indicates whether the data conversion is being performed or data is shifting through the system to MOSFET 516. A logic low on mode signal 906 indicates the conversion is taking place and keeps the output of FSK modulator 612 at a logic low. A logic high on mode signal 906 indicates data is being shifted out and allows the output of multiplexer 908 to pass through FSK modulator 612. Because the output of FSK modulator 612 is connected directly to MOSFET 516, turning off the output prevents MOSFET 516 from unnecessarily shorting out tag coil 510 and wasting power during the more power intensive conversion process.

The primary benefits of ADC 100 are the simple, space saving design and low current requirements. Current is a primary concern given the inductively powered nature of tag system 502. SPICE simulations show that when fabricated on 1.5 micron complementary metal-oxide semiconductor (CMOS) process with a carrier signal frequency of 125 kHz, ADC 100 consumes approximately 30 microamps root-mean square current for an 8-bit counter over an oscillation range of 190 kHz to 210 kHz which yields approximately four bits of resolution. This current measurement accounts for the current draw of variable oscillator 104, frequency divider 106, and n-bit counter 108, as well as the quiescent current of other digital circuits not active during the conversion process. Compare this current consumption to that of an on-die successive approximation style classic ADC. An 8-bit ADC fabricated on the same 1.5 micron CMOS process consumes over 100 microamps during its conversion process. ADC 100 also needs less than a quarter of the available die space to achieve the same resolution.

The word "example" is used herein to mean serving as an example, instance, or illustration. Any aspect or design described herein as "example" is not necessarily to be construed as preferred or advantageous over other aspects or designs. Further, for the purposes of this disclosure and unless otherwise specified, "a" or "an" means "one or more".

The foregoing description of example embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An analog-to-digital converter comprising:
   a variable oscillator coupled to a sensor and configured to generate an oscillating signal based on a measurement generated by the sensor;
   a frequency divider coupled to the variable oscillator and configured to divide a frequency of the oscillating signal;
   a clock circuit configured to generate a clock signal at a defined frequency, wherein the clock signal is at a carrier frequency of a radio frequency identifier system; and
   a counter coupled to the frequency divider and to the clock and configured to generate a bit stream representative of a first number of periods of the clock signal during a second number of periods of the divided oscillating signal.

2. The analog-to-digital converter of claim 1, wherein the second number of periods is one.

3. The analog-to-digital converter of claim 1, wherein the counter comprises a plurality of shift registers configured to generate the bit stream, wherein the bit stream comprises a specific number of bits based on a number of the plurality of shift registers.

4. The analog-to-digital converter of claim 1, wherein the variable oscillator is a multivibrator.

5. The analog-to-digital converter of claim 1, wherein the clock circuit is a clock recovery circuit configured to convert a carrier signal to a square wave signal.

6. A device comprising:
   a sensor; and
   an analog-to-digital converter comprising
      a variable oscillator coupled to the sensor and configured to generate an oscillating signal based on a measurement generated by the sensor;
      a frequency divider coupled to the variable oscillator and configured to divide a frequency of the oscillating signal;
      a clock circuit configured to generate a clock signal at a defined frequency, wherein the clock signal is at a carrier frequency of a radio frequency identifier system; and
      a counter coupled to the frequency divider and to the clock and configured to generate a bit stream representative of a first number of periods of the clock signal during a second number of periods of the divided oscillating signal.

7. The device of claim 6, wherein the sensor is a capacitive or a resistive sensing element.

8. The device of claim 6, further comprising a coil coupled to receive the bit stream and generate a magnetic and/or an electric field based on the received bit stream.

9. The device of claim 6, wherein the clock circuit is a clock recovery circuit configured to convert a carrier signal to a square wave signal.

10. The device of claim 6, further comprising a modulator circuit coupled to receive the generated bit stream and coupled to receive a first frequency signal at a first frequency from the frequency divider and to receive a second frequency signal at a second frequency different from the first frequency from the frequency divider.

11. The device of claim 10, wherein the first frequency and the second frequency are the highest two frequencies generated from the frequency divider.

12. The device of claim 10, wherein the modulator circuit is configured to encode the received bit stream at the first frequency for a logic high bit value and at the second frequency for a logic low bit value.

13. The device of claim 6, further comprising an enable/reset circuit coupled to the analog-to-digital converter and configured to provide a signal enabling operation of the analog-to-digital converter.

14. The device of claim 13, further comprising a turn-on/brown-out circuit coupled to the enable/reset circuit and configured to provide a signal to the enable/reset circuit indicating a full power supply voltage.

15. The device of claim 6, further comprising a cyclic redundancy check generator coupled to the analog-to-digital converter and configured to receive the generated bit stream and generate a checkword based on the received bit stream.

16. The device of claim 15, wherein the cyclic redundancy check generator is further configured to append the generated checkword to the received bit stream.

17. A telemetry system comprising:
a first device comprising
a sensor;
an analog-to-digital converter comprising
a variable oscillator coupled to the sensor and configured to generate an oscillating signal based on a measurement generated by the sensor;
a frequency divider coupled to the variable oscillator and configured to divide a frequency of the oscillating signal;
a clock circuit configured to generate a clock signal at a defined frequency; and
a counter coupled to the frequency divider and to the clock and configured to generate a bit stream representative of a first number of periods of the clock signal during a second number of periods of the divided oscillating signal; and
a first coil coupled to receive the bit stream and generate a magnetic and/or an electric field based on the received bit stream; and
a second device comprising
a second coil configured to receive the generated magnetic and/or electric field; and
a signal processor configured to determine the measurement generated by the sensor from the received magnetic and/or electric field.

18. The telemetry system of claim 17, wherein the clock circuit is a clock recovery circuit configured to convert a carrier signal to a square wave signal.

* * * * *